United States Patent
Imaizumi et al.

(10) Patent No.: US 10,012,901 B2
(45) Date of Patent: *Jul. 3, 2018

(54) PHOTOSENSITIVE RESIN COMPOSITION, RESIST LAMINATE, AND ARTICLES OBTAINED BY CURING SAME (5)

(71) Applicant: Nippon Kayaku Kabushiki Kaisha, Tokyo (JP)

(72) Inventors: Naoko Imaizumi, Tokyo (JP); Shinya Inagaki, Tokyo (JP); Nao Honda, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 44 days.

This patent is subject to a terminal disclaimer.

(21) Appl. No.: 14/443,669

(22) PCT Filed: Nov. 21, 2013

(86) PCT No.: PCT/JP2013/081354
§ 371 (c)(1),
(2) Date: May 19, 2015

(87) PCT Pub. No.: WO2014/080967
PCT Pub. Date: May 30, 2014

(65) Prior Publication Data
US 2015/0293444 A1    Oct. 15, 2015

(30) Foreign Application Priority Data
Nov. 22, 2012  (JP) .................................. 2012-256119

(51) Int. Cl.
| | |
|---|---|
| G03F 7/004 | (2006.01) |
| G03F 7/038 | (2006.01) |
| C08G 59/38 | (2006.01) |
| C08L 63/00 | (2006.01) |
| G03F 7/075 | (2006.01) |
| B32B 27/08 | (2006.01) |
| B32B 27/32 | (2006.01) |
| C08G 59/06 | (2006.01) |
| C08G 59/22 | (2006.01) |
| C08G 59/24 | (2006.01) |

(52) U.S. Cl.
CPC .............. *G03F 7/004* (2013.01); *B32B 27/08* (2013.01); *B32B 27/32* (2013.01); *C08G 59/063* (2013.01); *C08G 59/226* (2013.01); *C08G 59/245* (2013.01); *C08G 59/38* (2013.01); *C08L 63/00* (2013.01); *G03F 7/038* (2013.01); *G03F 7/0751* (2013.01); *G03F 7/0755* (2013.01); *B32B 2255/10* (2013.01); *B32B 2255/26* (2013.01); *B32B 2307/71* (2013.01); *B32B 2559/00* (2013.01)

(58) Field of Classification Search
CPC ....................................................... G03F 7/004
See application file for complete search history.

(56) References Cited

U.S. PATENT DOCUMENTS

| | | | |
|---|---|---|---|
| 4,256,828 A | 3/1981 | Smith | |
| 4,882,245 A | 11/1989 | Gelorme et al. | |

(Continued)

FOREIGN PATENT DOCUMENTS

| | | |
|---|---|---|
| JP | 3-17117 A | 1/1991 |
| JP | 9-255765 A | 9/1997 |

(Continued)

OTHER PUBLICATIONS

PLACCEL flyer, date N/A.*

(Continued)

*Primary Examiner* — Irina Krylova
(74) *Attorney, Agent, or Firm* — Nields, Lemack & Frame, LLC

(57) ABSTRACT

The purpose of the present invention is to provide the following: a photosensitive epoxy resin composition that, via photolithography, can form a high-resolution, low-stress image that has vertical side walls and resists moisture and heat, and/or a resist laminate using said photosensitive epoxy resin composition; and an article or articles obtained by curing said photosensitive epoxy resin composition and/ or resist laminate. The present invention is a photosensitive resin composition containing the following: an epoxy resin (A), a polyol compound (B) having a specific structure, a cationic-polymerization photoinitiator (C), a silane compound (D) containing an epoxy group, and a reactive epoxy monomer (E) having a specific structure. The epoxy resin (A) contains the phenol derivative represented by formula (1), an epoxy resin (a) obtained via a reaction with epihalohydrin, and an epoxy resin (b) that can be represented by formula (2).

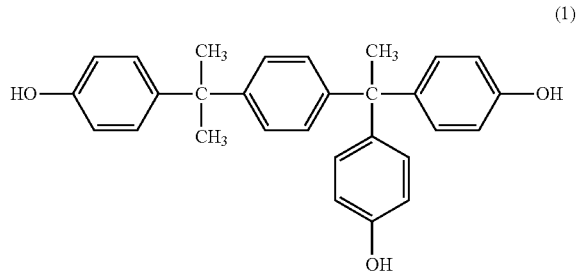

(1)

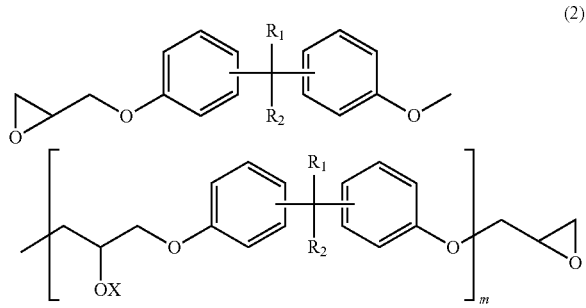

(2)

8 Claims, No Drawings

(56) References Cited

U.S. PATENT DOCUMENTS

| | | | |
|---|---|---|---|
| 6,127,085 A * | 10/2000 | Yamamura | G03F 7/0037 |
| | | | 430/171 |
| 9,448,479 B2 | 9/2016 | Imaizumi et al. | |
| 9,684,239 B2 | 6/2017 | Imaizumi et al. | |
| 2003/0220455 A1 | 11/2003 | Ichiroku et al. | |
| 2005/0260522 A1* | 11/2005 | Weber | B82Y 10/00 |
| | | | 430/280.1 |
| 2007/0265427 A1 | 11/2007 | Takai et al. | |
| 2013/0108961 A1 | 5/2013 | Oonishi et al. | |
| 2015/0293448 A1* | 10/2015 | Imaizumi | G03F 7/038 |
| | | | 428/414 |
| 2015/0301450 A1 | 10/2015 | Imaizumi et al. | |
| 2015/0309409 A1 | 10/2015 | Imaizumi et al. | |

FOREIGN PATENT DOCUMENTS

| | | | |
|---|---|---|---|
| JP | 10-168165 A | | 6/1998 |
| JP | 2000-44776 A | | 2/2000 |
| JP | 2001-164094 A | | 6/2001 |
| JP | 2006-169326 A | | 6/2006 |
| JP | 2008-20838 A | | 1/2008 |
| JP | 2008-20839 A | | 1/2008 |
| JP | 2008-26667 A | | 2/2008 |
| JP | 2009075261 | * | 4/2009 |
| JP | 2009-263544 A | | 11/2009 |
| JP | 2009-265449 A | | 11/2009 |
| JP | 2010-24364 A | | 2/2010 |
| JP | 2010-271401 A | | 12/2010 |
| JP | 2010-276694 A | | 12/2010 |
| TW | 200948920 A | | 12/2009 |
| WO | 20091151050 A1 | | 12/2009 |
| WO | 2010/001919 A1 | | 1/2010 |
| WO | 20121008472 A1 | | 1/2012 |
| WO | 2013/036502 A1 | | 3/2013 |
| WO | 2013/134104 A2 | | 9/2013 |
| WO | 2014/080975 A1 | | 5/2014 |
| WO | 2014/080976 A1 | | 5/2014 |
| WO | 2014/080977 A1 | | 5/2014 |

OTHER PUBLICATIONS

European communication dated May 9, 2016 in co-pending European patent application No. 13849046.1.
Office action dated Apr. 6, 2016 in co-pending U.S. Appl. No. 14/437,940.
Office action dated Apr. 6, 2016 in co-pending U.S. Appl. No. 14/443,679.
International Search Report/Written Opinion dated Nov. 19, 2013 in co-pending PCT application No. PCT/JP2013/078933.
International Preliminary Report on Patentability dated May 7, 2015 in co-pending PCT application No. PCT/2013/078933.
International Search Report/Written Opinion dated Nov. 19, 2013 in co-pending PCT application No. PCT/JP2013/078936.
International Preliminary Report on Patentability dated May 7, 2015 in co-pending PCT application No. PCT/JP2013/078936.
International Search Report/Written Opinion dated Dec. 17, 2013 in corresponding PCT application No. PCT/JP2013/081354.
International Preliminary Report on Patentability dated Jun. 4, 2015 in corresponding PCT application No. PCT/JP2013/081354.
International Search Report/Written Opinion dated Dec. 17, 2013 in co-pending PCT application No. PCT/JP2013/081358.
International Preliminary Report on Patentability dated Jun. 4, 2015 in co-pending PCT application No. PCT/JP2013/081358.
Proc. SPIE, vol. 2438, pp. 846-852, 1995, "High Aspect Ratio Resist for Thick Film Applications", LaBianca, et al.
European communication dated Jul. 22, 2016 in corresponding European patent application No. 13856834.0.
Notice of Allowance dated Jun. 21, 2016 in co-pending U.S. Appl. No. 14/443,679.
Taiwanese communication, with English translation, dated Jan. 16, 2017 in corresponding Taiwanese patent application No. 102142468.
European communication dated Jan. 30, 2017 in co-pending European patent application No. 13849119.6.
Notice of Allowance dated Jan. 25, 2017 in co-pending U.S. Appl. No. 14/437,940.
Office Action dated Jul. 18, 2017 in co-pending U.S. Appl. No. 14/437,933.
Final refection dated Nov. 24, 2017 in co-pending U.S. Appl. No. 14/437,933.

* cited by examiner

PHOTOSENSITIVE RESIN COMPOSITION, RESIST LAMINATE, AND ARTICLES OBTAINED BY CURING SAME (5)

TECHNICAL FIELD

The present invention relates to a photosensitive resin composition which enables an image having a good sidewall profile and excellent resolution to be formed, having excellent tight adhesion to a substrate after a test for moisture and heat due to a small internal stress after curing; and relates to a cured product thereof. A cured product of the photosensitive resin composition according to the present invention is useful in manufacturing of an MEMS (microelectromechanical system) component, a μ-TAS (micro total analysis system) component, a microreactor component, and an insulating layer of electronic components such as a capacitor and an inductor, an LIGA component, a mold and a stamp for microinjection and thermal embossing, a screen or a stencil for microprinting application, a packaging component for MEMS and semiconductors, a BioMEMS and a biophotonic device, and a printed circuit board.

BACKGROUND ART

Among photosensitive resin compositions, ones to which photolithography is applicable are called photoresists and widely used in semiconductors, MEMS/micromachine applications, and the like. In such applications, photolithography is performed through the successive steps of pattern exposing on a substrate and developing in a developer for selective removal of the exposed areas or the non-exposed areas. The photoresists have a positive type and a negative type. The positive type allows the exposed portions to be dissolved in a developer. In contrast, the negative type allows the exposed portions to be insolubilized. In an advanced technology field, electropackage applications and MEMS applications require not only the capability of forming a uniform spin coating film, but also a high aspect ratio, the vertical sidewall profile of a thick film, high tight adhesion to a substrate, and the like. The aspect ratio is calculated from (resist film thickness)/(pattern line width), indicating the performance of photolithography as an important property.

According to the composition having the main component of a bisphenol A type novolac epoxy resin disclosed in Patent Literature 1 and Non Patent Literature 1, a photosensitive image having an extremely high resolution and a high aspect ratio, and a cured product of photosensitive resin can be formed. However, the produced cured resin product tends to be excessively brittle depending on application, occasionally resulting in cracking (crazing) during development or when internal stress is generated. Accordingly, the cured resin product may cause not only reduction in adhesion depending on the type of substrate to which the resin composition is applied, but also detachment between a substrate and the cured resin product in some cases. All the problems occur during cure shrinkage of the composition, due to the stress accumulated in the cured resin product. A large cure shrinkage causes bending (warpage) of a substrate in many cases.

Further, it was found that a substrate with the cured resin product formed thereon caused detachment of the cured resin product from the substrate when subjected to a test for moisture and heat, i.e. an accelerated durability test, (80° C., 100%, 24 hours). Accordingly, use of the cured resin product in applications in an MEMS package, a semiconductor package, a component for forming microreactors, and the like caused inconvenience with poor durability.

In Patent Literature 2, a photosensitive composition comprising an epoxy resin having an average number of functional groups of 1.5 or more, a hydroxyl-containing additive, and a cationic photopolymerization initiator is disclosed. The Literature describes that addition of the hydroxyl-containing additive increases the flexibility of a coating film with a thickness up to 100 μm with the effect of reducing shrinkage. The composition disclosed in the Literature, however, has a resolution as a photoresist of about 90 μm, producing a photosensitive image with residues of skirt shape on the edge portions and a round shape on the top portion after development. As a result, the photosensitive composition was significantly unsuitable for an MEMS package, a semiconductor package, a microreactor and the like.

CITATION LIST

Patent Literature

Patent Literature 1: U.S. Pat. No. 4,882,245
Patent Literature 2: U.S. Pat. No. 4,256,828

Non Patent Literature

Non Patent Literature 1: N. Labianca and J. D. Gelorme "High aspect ratio resist for thick film applications", Proc. SPIE, Vol. 2438, p. 846 (1995)

SUMMARY OF INVENTION

Technical Problem

It is an object of the present invention, in view of the circumstances as described above, to provide an epoxy resin composition to be cured by cationic polymerization for use in the fields of semiconductors and MEMS/micromachine applications, i.e. a photosensitive resin composition enabling an image having a fine resolution, a low stress, and resistance to moisture and heat having a vertical sidewall profile to be formed; and/or a laminate thereof; and a cured product thereof.

Solution to Problem

Through extensive investigation, the present inventors found that the photosensitive resin composition of the present invention can solve the problem.

The various aspects of the present invention are as follows.

[1].

A photosensitive resin composition comprising: an epoxy resin (A), a polyol compound (B), a cationic photopolymerization initiator (C), an epoxy group-containing silane compound (D), and a reactive epoxy monomer (E);

the epoxy resin (A) comprising an epoxy resin (a) produced from reaction of a phenol derivative represented by the following Formula (1) and epihalohydrin:

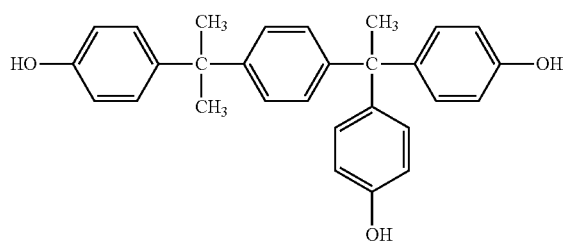

and an epoxy resin (b) represented by the following Formula (2):

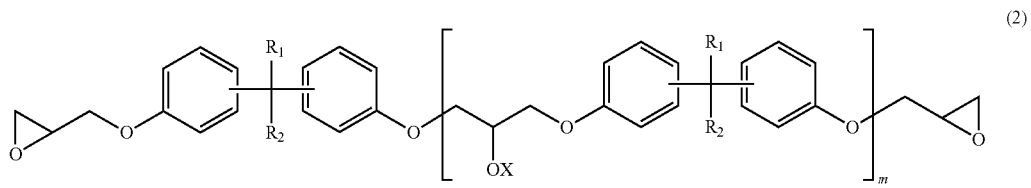

wherein m is an average value, representing a real number in the range from 2 to 30, $R_1$ and $R_2$ each independently represent a hydrogen atom, an alkyl group having 1 to 4 carbon atoms, or a trifluoromethyl group, X each independently represents a hydrogen atom or a glycidyl group, and at least one of a plurality of X present is a glycidyl group;

the polyol compound (B) comprising a polyester polyol represented by the following Formula (3):

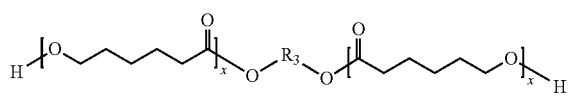

wherein x is an average value, representing a real number in the range from 1 to 15, and $R_3$ represents a divalent aliphatic hydrocarbon group which may contain at least one ether bond within the carbon chain;

and/or a polyester polyol represented by the following Formula (4):

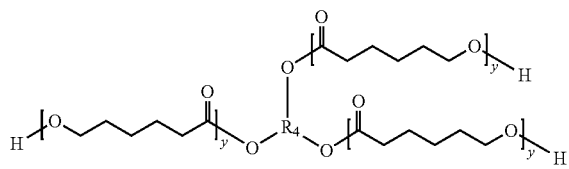

wherein y is an average value, representing a real number in the range from 1 to 6, and $R_4$ represents a trivalent aliphatic hydrocarbon group which may contain at least one ether bond within the carbon chain; and the reactive epoxy monomer (E) comprising an epoxy compound represented by the following Formula (10) and/or an epoxy compound represented by the following Formula (11):

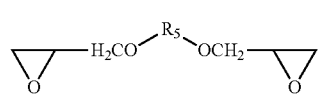

wherein $R_5$ represents a divalent aliphatic hydrocarbon group having 1 to 11 carbon atoms;

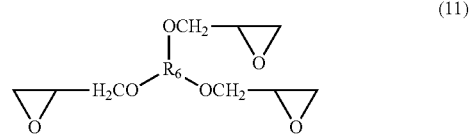

wherein $R_6$ represents a trivalent aliphatic hydrocarbon group having 1 to 11 carbon atoms.

[2].
The photosensitive resin composition according to the item [1], wherein the reactive epoxy monomer (E) comprises trimethylolpropane triglycidyl ether.

[3].
The photosensitive resin composition according to the item [1], wherein a blending ratio of the reactive epoxy monomer (E) is 2 to 12 mass % relative to a total mass of the epoxy resin (A) and the polyol compound (B).

[4].
The photosensitive resin composition according to the item [1], wherein a blending ratio of the polyol compound (B) is 1 to 30 mass % relative to a total mass of the epoxy resin (A).

[5].
The photosensitive resin composition according to the item [1], wherein a blending ratio of the cationic photopolymerization initiator (C) is 0.1 to 15 mass % relative to a total mass of the epoxy resin (A), the polyol compound (B), and the reactive epoxy monomer (E).

[6].
The photosensitive resin composition according to the item [1], wherein the epoxy group-containing silane compound (D) is an epoxy group-containing alkoxysilane compound.

[7].
The photosensitive resin composition according to the item [1], wherein a blending ratio of the epoxy group-containing silane compound (D) is 1 to 15 mass % relative to a total mass of the epoxy resin (A), the polyol compound (B), the cationic photopolymerization initiator (C), and the reactive epoxy monomer (E).

[8].
The photosensitive resin composition according to the item [1], further comprising a solvent (F).

[9].
The photosensitive resin composition according to the item [8], wherein a blending ratio of the solvent (F) is 5 to 95 mass % relative to a total mass of the photosensitive resin composition including the solvent (F).

[10].
A cured product of the photosensitive resin composition according to any one of the items [1] to [9].

[11].

A resist laminate comprising the photosensitive resin composition according to any one of the items [1] to [9] sandwiched between two substrates.

[12].

A cured product of a dry film resist produced from the resist laminate according to the item [11].

Advantageous Effect of Invention

The photosensitive resin composition of the present invention enables a fine pattern having a vertical sidewall profile to be formed by photolithography, and the cured product thereof has high resolution, low stress, and properties excellent in resistance to moisture and heat. Accordingly, by using the photosensitive resin composition of the present invention, a permanent resist and a cured product having properties required in the field of semiconductors, and MEMS/micromachine applications, particularly required for MEMS packages, semiconductor packages and components for forming microreactors, can be produced.

DESCRIPTION OF EMBODIMENTS

The present invention is described in the following.

The epoxy resin (A) contained in the photosensitive resin composition of the present invention includes both of an epoxy resin (a) produced by a reaction of a phenol derivative represented by the Formula (1) and epihalohydrin, and an epoxy resin (b) represented by the Formula (2). Among them, the epoxy resin (a) contributes to the vertical sidewall profile and fine resolution of a cured product (pattern) produced from the photosensitive resin composition of the present invention by photolithography. The epoxy resin (a) can be produced from a phenol derivative represented by the Formula (1) and epihalohydrin by a conventionally known synthesis method of epoxy resins.

Examples of commonly known synthetic methods of the epoxy resin (a) include a method by adding alkali such as sodium hydroxide to a mixed solution of a phenol derivative represented by Formula (1) and epihalohydrin dissolved in a solvent capable of dissolving the same, and raising temperature to the reaction temperature for performing an addition reaction and a ring-closing reaction, repeating water washing of the reaction solution, separation and removal of the aqueous layer, and distilling off the solvent from the oil layer at the end. The halogen of epihalohydrin may be selected from F, Cl, Br and I, typically being Cl or Br. The reaction of the phenol derivative represented by Formula (1) and epihalohydrin is performed using epihalohydrin in an amount of, typically 0.3 to 30 mol, preferably 1 to 20 mol, more preferably 3 to 15 mol relative to 1 mole of the phenol derivative (equivalent to 3 mol of hydroxyl group). The epoxy resin (a) is produced by the reaction, being typically present as a mixture of a plurality of products.

It is known that the epoxy resin (a) having a different main component can be produced depending on the usage ratio between a phenol derivative represented by Formula (1) and epihalohydrin for use in the synthesis reaction. For example, in the case of using an excessive amount of epihalohydrin relative to the phenolic hydroxyl group of a phenol derivative, the epoxy resin (a) having a trifunctional epoxy resin as main component is produced with all the three phenolic hydroxyl groups in Formula (1) being epoxidized. As the usage of epihalohydrin is reduced relative to the phenolic hydroxyl groups, the content of polyfunctional epoxy resins having a large molecular weight increases, with a plurality of phenolic hydroxyl groups of the phenol derivative being bonded through epihalohydrin, and remaining phenolic hydroxyl groups being epoxidized.

Examples of the method for producing the epoxy resin (a) having a multimer epoxy resin as main component include a method for further reacting the epoxy resin (a) with a phenol derivative, other than the method by controlling the usage ratio between the phenol derivative and epihalohydrin. The epoxy resin (a) produced by the method also belongs to the category of the epoxy resin (a) contained in the photosensitive resin composition of the present invention.

As the epoxy resin (a) contained in the resin composition of the present invention, any one of the epoxy resin (a) having, as main component, the epoxy resin of phenol derivative monomers and the epoxy resin (a) having, as main component, the epoxy resin of phenol derivative multimers may be used, as long as the epoxy resin is produced from the reaction of a phenol derivative represented by Formula (1) and epihalohydrin. The epoxy resin (a) having any one of the epoxy resin of phenol derivative monomers, the epoxy resin of phenol derivative dimers (i.e., an epoxy resin having a structure with two phenol derivatives represented by Formula (1) bonded to each other through epihalohydrin), and the epoxy resin of phenol derivative trimers (i.e., an epoxy resin having a structure with three phenol derivatives represented by Formula (1) bonded to each other through epihalohydrin) as main component is preferred due to excellence in solvent solubility and easiness in handling with a low softening point. The epoxy resin (a) having the epoxy resin of phenol derivative monomers or the epoxy resin of phenol derivative dimers as main component is more preferred.

The term "main component" as used herein means the epoxy resin component with the largest content among a plurality of types of epoxy resins including monomer epoxy resins and multimer epoxy resins contained in the epoxy resin (a).

The specific structure of the epoxy resin (a) of monomers of the phenol derivative represented by Formula (1) is shown in the following Formula (5).

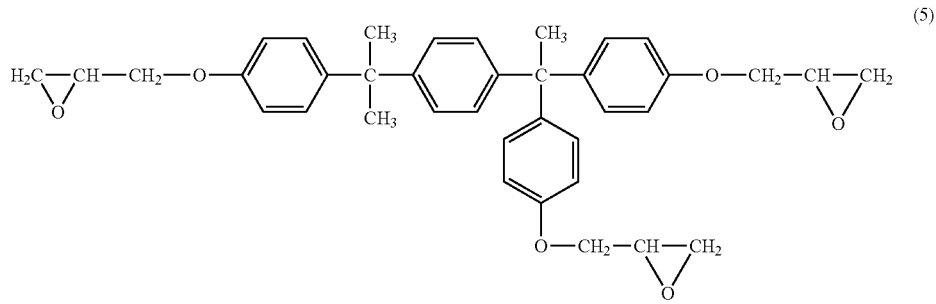 [SMILES: CC(C)(c1ccc(OCC2CO2)cc1)c1ccc(C(C)(c2ccc(OCC3CO3)cc2)c2ccc(OCC3CO3)cc2)cc1]

(5)

The specific structure of the epoxy resin (a) of dimers of the phenol derivative represented by Formula (1) is shown in the following Formula (6).
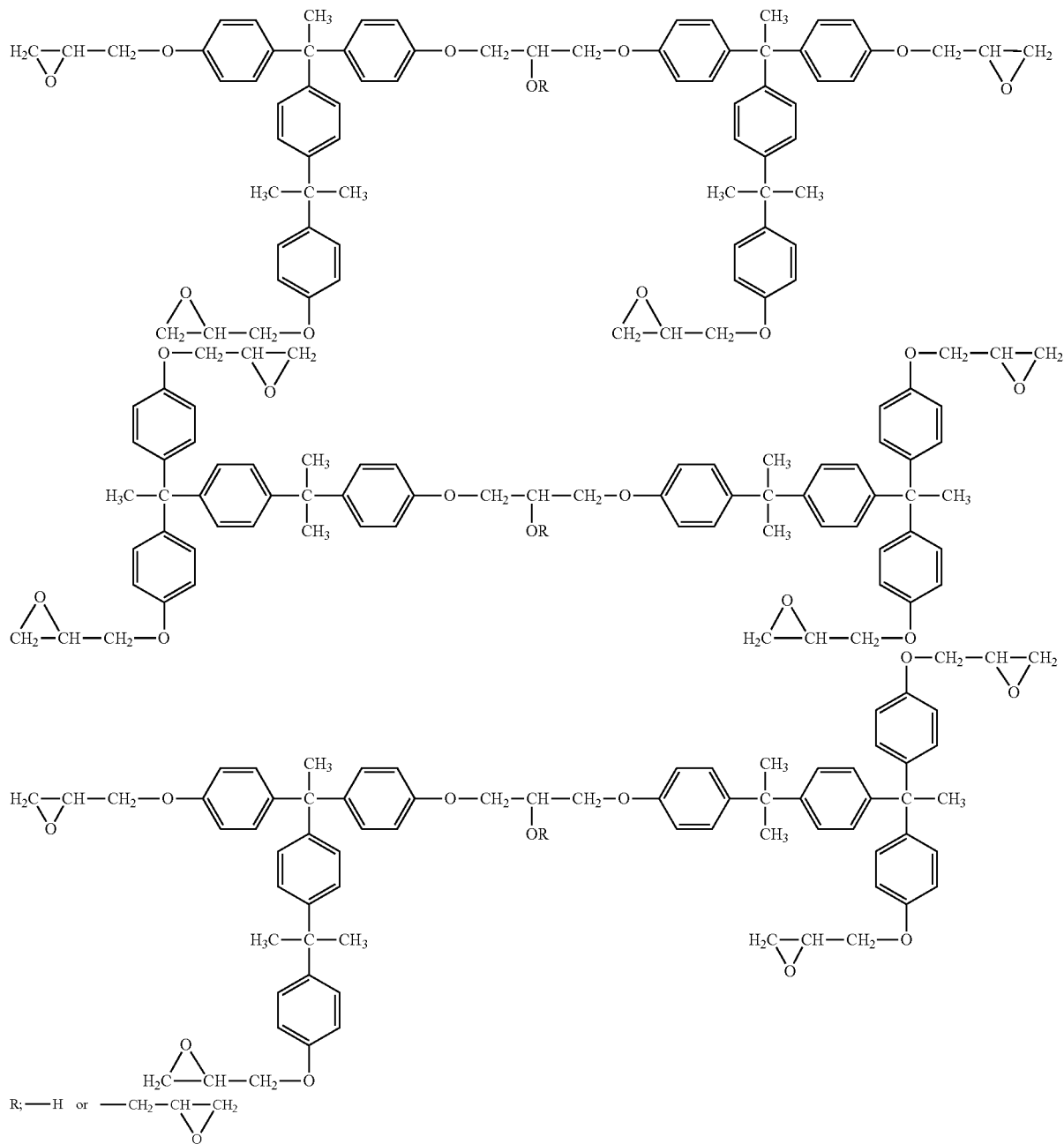
(6)
R; —H or —CH₂—CH—CH₂
              \\O/
The specific structure of the epoxy resin (a) of trimers of the phenol derivative represented by Formula (1) is shown in the following Formula (7).

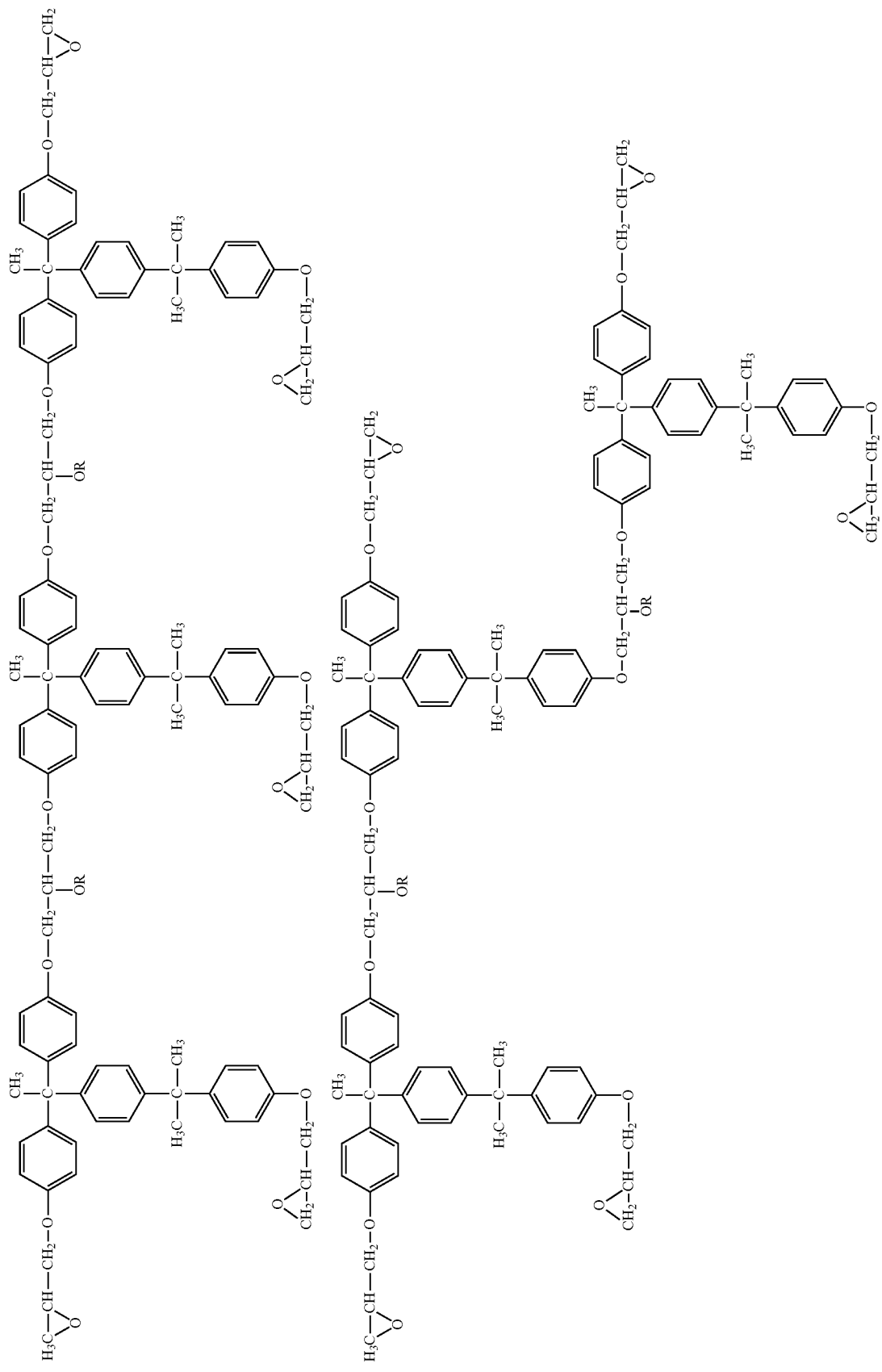

-continued
(7)
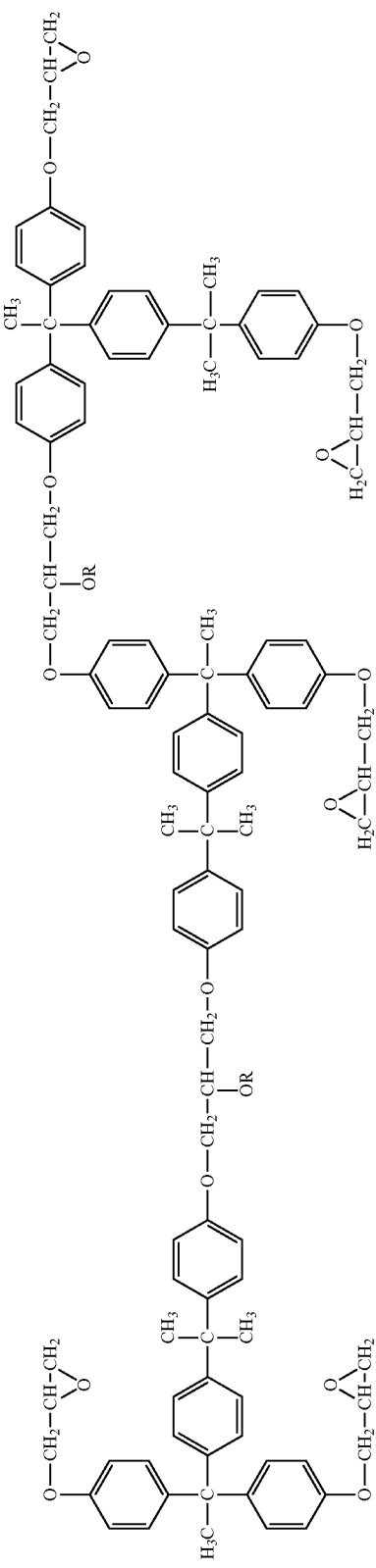
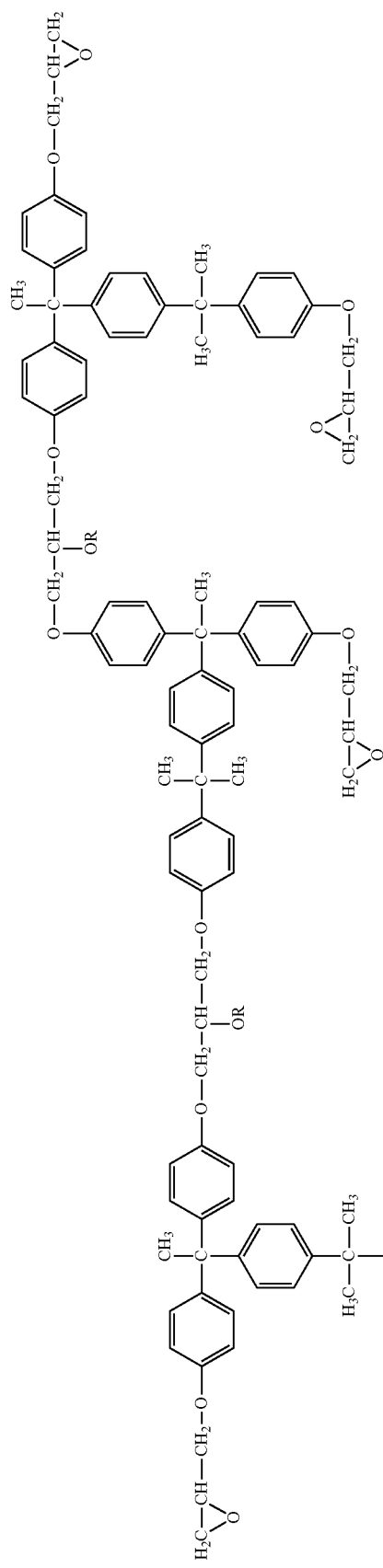

-continued
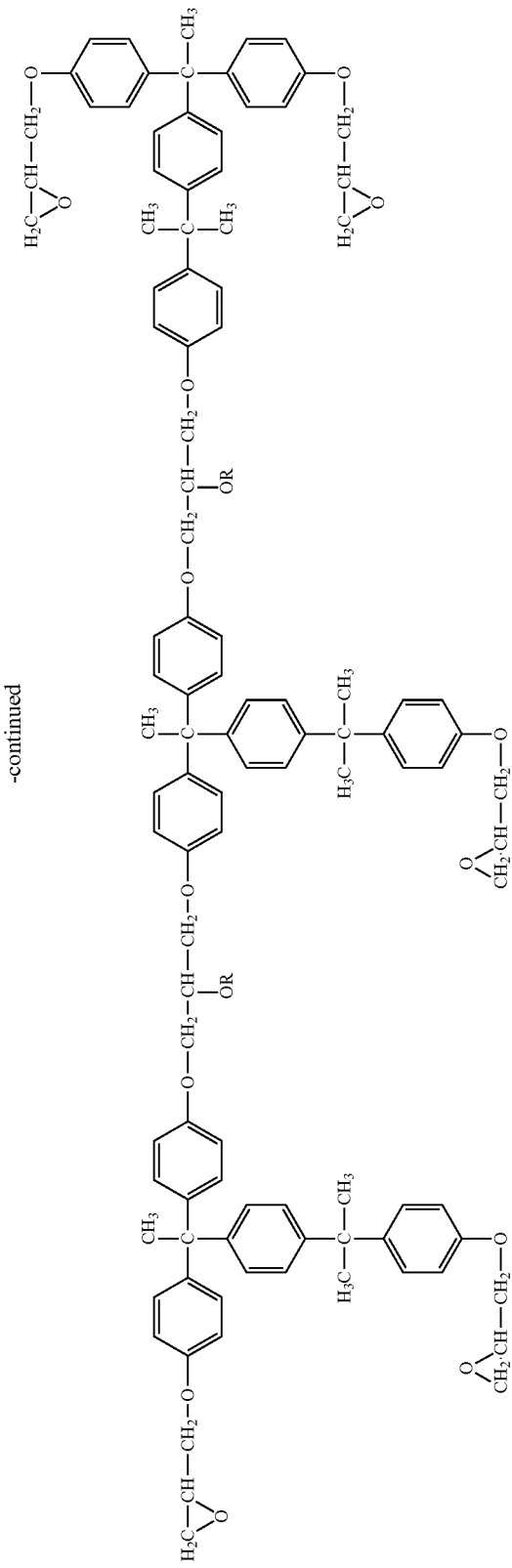

-continued
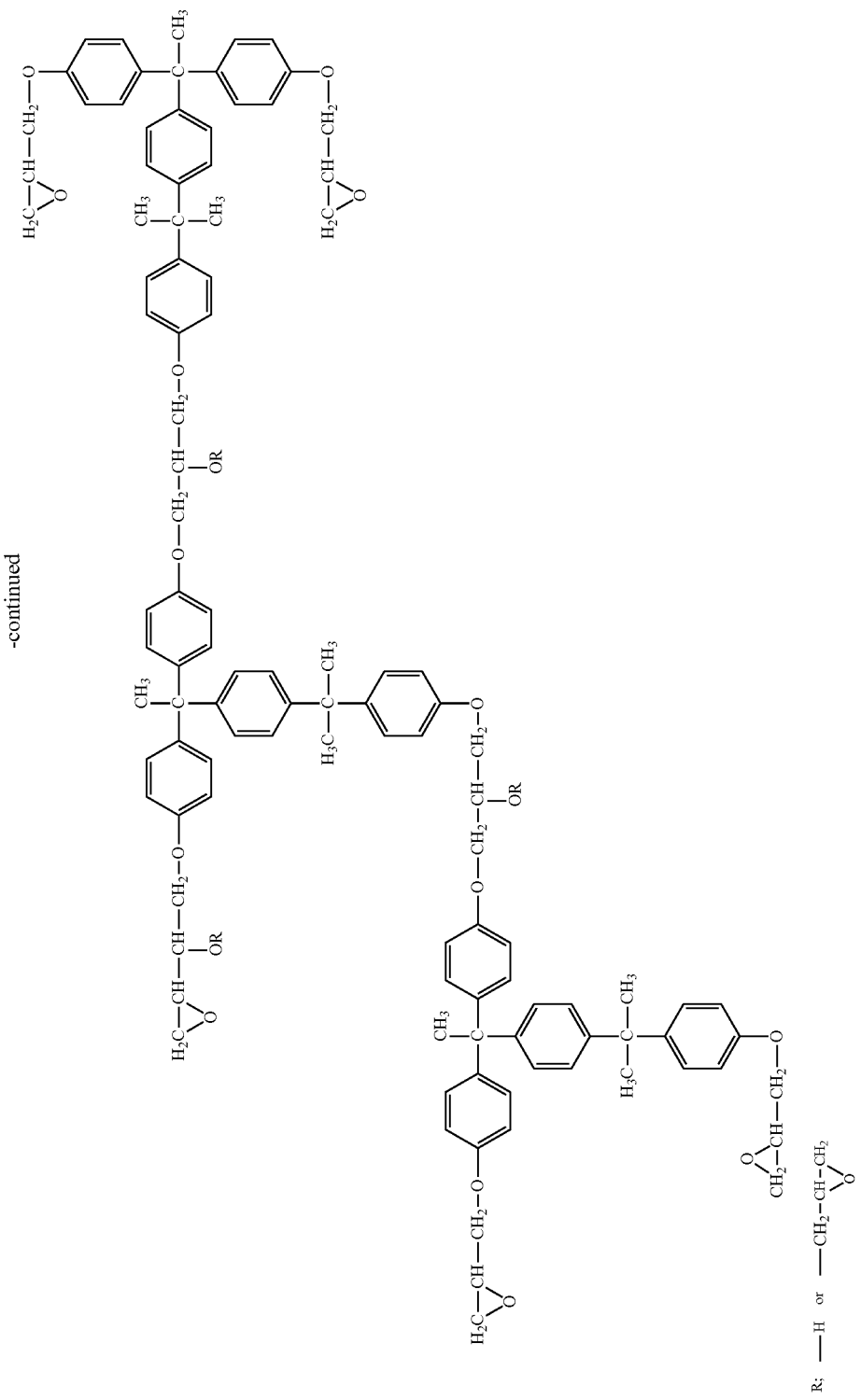
R: —H or —CH$_2$—CH—CH$_2$

The epoxy resin (a) has a weight average molecular weight of preferably in the range from 500 to 12000, more preferably from 500 to 9000. Preferred examples thereof include NC-6300H (trade name, made by Nippon Kayaku Co., Ltd., epoxy equivalent: 220 to 240 g/eq., softening point: 60 to 85° C.). In the present application, a weight average molecular weight means the value calculated in terms of polystyrene based on GPC measurement results, an epoxy equivalent means the value measured in accordance with JIS K-7236, and a softening point means the value measured in accordance with JIS K-7234, respectively.

The epoxy resin (b) imparts resolution and pliability to a cured product (pattern) produced from the photosensitive resin composition of the present invention by photolithography. Due to the improvement in the properties with use of the epoxy resin (b), resistance to moisture and heat on adhesion of the cured product can be enhanced. The epoxy resin (b) can be produced by further reacting a part of the alcoholic hydroxyl groups of a polycondensation product of bisphenol and epichlorohydrin with epichlorohydrin. Specific examples thereof include NER-7604, NER-7403, and NER-1302 (trade names, manufactured by Nippon Kayaku Co., Ltd.). In Formula (2) representing the epoxy resin (b), the average value of m means the average value for a plurality of compounds of reaction products. The epoxy resin (b) has an epoxy equivalent of preferably 250 to 400 g/eq., and a softening point of preferably 60 to 85° C.

In the photosensitive resin composition of the present invention, the usage of the epoxy resin (b) is typically 2 to 4900 mass %, preferably 5 to 100 mass %, more preferably 10 to 70 mass % relative to the mass of the epoxy resin (a). With a usage of the epoxy resin (b) relative to the mass of the epoxy resin (a) of 4900 mass % or less, a photosensitive image pattern having a vertical sidewall profile can be easily formed with suppression of a rounded pattern. With a usage of the epoxy resin (b) relative to the mass of the epoxy resin (a) of 2 mass % or more, the occurrence of cracks in the photosensitive image pattern surface can be effectively prevented.

The epoxy resin (A) contained in the photosensitive resin composition of the present invention may further include an epoxy resin other than the epoxy resin (a) and the epoxy resin (b) for use in combination. The epoxy resin for combination use is not particularly limited, and the blending ratio thereof is not particularly limited as long as it does not impair the effects of the present invention. The epoxy group-containing silane compound as component (D), however, is not encompassed within the scope of the epoxy resin (A), and an epoxy compound defined as the reactive epoxy monomer component (E) also is not.

The polyol compound (B) contained in the photosensitive resin composition of the present invention includes polyester polyols represented by Formula (3) and/or Formula (4). Any of the polyester polyols represented by Formulas (3) and (4) may be used in a form with a single species or with a mixture of a plurality of species. The polyol compound (B) includes a hydroxyl group to react with the epoxy group in the epoxy resin (A) under the influence of a strong acid catalyst, and serves as a reactive diluent. In particular, the use of polycaprolactone polyol represented by Formula (3) and/or Formula (4) enables a softened dry coating film to be produced by application of the resin composition and subsequent drying of the solvent on an as needed basis. Consequently, stress induction in the steps of exposure curing, development, and thermal curing in photolithography can be avoided with reduced shrinkage, resulting in prevention of the occurrence of cracks in a photosensitive image. In the case where the dried coating film of the photosensitive resin composition is sandwiched between substrates for use as a resist laminate (dry film), the effect of preventing the occurrence of cracks in the resist laminate can also be obtained when the resist laminate as a long roll is wound around a plastic cylinder.

In Formula (3), x is an average value, representing a real number in the range of 1 to 15, preferably a real number in the range of 1 to 10. The average value as used herein means an average value of the two x's described in Formula (3). For example, with one x being 4, and another x being 6, the average value x is 5.

In Formula (3), the $R_3$ represents a divalent aliphatic hydrocarbon group which may contain at least one ether bond within the carbon chain. The aliphatic hydrocarbon group represented by $R_3$ is typically a divalent aliphatic hydrocarbon group with a straight or branched chain having 1 to 15 carbon atoms, preferably a divalent aliphatic hydrocarbon group with a straight or branched chain having 1 to 10 carbon atoms, more preferably a divalent aliphatic hydrocarbon group with a straight or branched chain having 2 to 8 carbon atoms. Specific examples thereof include strait-chain aliphatic hydrocarbon groups such as a methylene group, an ethylene group, a propylene group, a butylene group, and a pentylene group, and branched-chain aliphatic hydrocarbon groups composed of the straight chain aliphatic hydrocarbon group to which an alkyl group is bonded as a side chain.

Specific examples of the divalent aliphatic hydrocarbon group which contains at least one ether bond within the carbon chain (i.e. a group where a plurality of aliphatic hydrocarbon moieties are connected to each other through an oxygen atom) include a linked group where a methylene group and an ethylene group are bonded through an oxygen atom. The number of oxygen atoms in the linked group (i.e. the number of ether bonds) is not particularly limited. For example, a linked group including the linked group composed of a methylene group, an oxygen atom, and an ethylene group to which an oxygen atom and an ethylene group are further bonded may be included in the definition of $R_3$. The divalent aliphatic hydrocarbon group which contains at least one ether bond within the carbon chain preferably has a number of carbon atoms falling within the aforementioned range (provided that it is 2 or more carbon atoms), with any of the combinations of straight chains only, branched chains only, or both a straight chain and a branched chain. The linked group may contain a plurality of aliphatic hydrocarbon groups having different numbers of carbon atoms, respectively. The number of oxygen atoms in the linked group (i.e. the number of ether bonds) is typically 1 to 3, preferably 1 to 2, more preferably 1.

The polyester polyol represented by Formula (3) is available as a commercial product. Specific examples thereof include: "PLACCEL 205" having a molecular weight of 530 and an OH value of 210 mg KOH/g, "PLACCEL 210" having a molecular weight of 1000 and an OH value of 110 mg KOH/g, and "PLACCEL 220" having a molecular weight of 2000 and an OH value of 56 mg KOH/g (trade names, made by Daicel Corporation in all the cases); and "CAPA 2054" having a molecular weight of 550 and an OH value of 204 mg KOH/g, "CAPA 2100" having a molecular weight of 1000 and an OH value of 112 mg KOH/g, and "CAPA 2200" having a molecular weight of 2000 and an OH value of 56 mg KOH/g, (trade names, made by Perstorp Holding AB in all the cases).

In Formula (4), y is an average value, representing a real number in the range of 1 to 6, preferably a real number in the range of 1 to 4. The average value as used herein means an average value of the three y described in Formula (4). For example, with the three y's being 2, 3, and 4, respectively, the average value y is 3.

The $R_4$ represents a trivalent aliphatic hydrocarbon group which may include at least one ether bond within the carbon chain. The aliphatic hydrocarbon group represented by $R_4$ is typically a trivalent aliphatic hydrocarbon group having 1 to 15 carbon atoms, preferably a trivalent aliphatic hydrocarbon group having 1 to 10 carbon atoms, more preferably a trivalent aliphatic hydrocarbon group having 2 to 8 carbon atoms. The aliphatic hydrocarbon group may include an alkyl group as side chain.

Specific examples of the trivalent aliphatic hydrocarbon group which contains at least one ether bond within the carbon chain (i.e. a group where a plurality of aliphatic hydrocarbon moieties are bonded to each other through an oxygen atom) include a linked group where a methylene group is assigned to one bond of a methine group through an oxygen atom. The trivalent aliphatic hydrocarbon group which contains at least one ether bond within the carbon chain preferably has a number of carbon atoms falling within the aforementioned range (provided that it is 2 or more carbon atoms). Other matters on the trivalent aliphatic hydrocarbon group which contains at least one ether bond within the carbon chain are dealt with in the same manner as in the above description on the divalent aliphatic hydrocarbon group which contains at least one ether bond within the carbon chain represented by $R_3$.

The polyester polyol represented by Formula (4) is available as a commercial product. Specific examples thereof include: "CAPA 3050" having a molecular weight of 530 to 550 and an OH value of 310 mg KOH/g, "CAPA 3091" having a molecular weight of 900 and an OH value of 183 mg KOH/g, and "CAPA 3201" having a molecular weight of 2000 and an OH value of 84 mg KOH/g, (trade names, made by Perstorp Holding AB in all the cases); and "PLACCEL 305" having a molecular weight of 530 to 550 and an OH value of 310 mg KOH/g, "PLACCEL 308" having a molecular weight of 850 and an OH value of 195 mg KOH/g, "PLACCEL 312" having a molecular weight of 1250 and an OH value of 135 mg KOH/g, and "PLACCEL 320" having a molecular weight of 2000 and an OH value of 84 mg KOH/g (trade names, made by Daicel Corporation in all the cases).

In the photosensitive resin composition of the present invention, the blending ratio of the polyol compound (B) is typically 1 to 30 mass %, preferably 2 to 25 mass %, relative to the total mass of the epoxy resin (A). With a blending ratio of the polyol compound (B) of 30 mass % or less, a photosensitive image pattern having a vertical sidewall profile can be easily formed with suppression of a rounded pattern. With a blending ratio of the polyol compound (B) of 1 mass % or more, the dilution effect and the effect of softening the dried coating film are sufficiently obtained, resulting in effective prevention of the occurrence of cracks in the photosensitive image pattern surface. In the case of using the polyester polyols represented by Formula (3) and Formula (4) in combination, the usage ratio between both is not particularly limited as long as the blending ratio of the polyol compound (B) to the epoxy resin (A) falls within the range.

The polyol compound (B) contained in the photosensitive resin composition of the present invention may further include a polyol compound other than the polyol compounds represented by the Formulas (3) and (4) for use in combination. The polyol compound for combination use is not particularly limited, and the blending ratio of the polyol compound for combination use is not particularly limited as long as it does not impair the effects of the present invention.

The cationic photopolymerization initiator (C) contained in the photosensitive resin composition of the present invention is a compound which generates cations when exposed to radiation of UV rays, far UV rays, excimer laser such as KrF and ArF, X rays, electron beams, and the like, so as to function as a polymerization initiator.

Examples of the cationic photopolymerization initiator (C) include an aromatic iodonium complex salt and an aromatic sulfonium complex salt. Among them, specific examples of the aromatic iodonium complex salt include diphenyl iodonium tetrakis(pentafluorophenyl)borate, diphenyl iodonium hexafluorophosphate, diphenyl iodonium hexafluoroantimonate, di(4-nonylphenyl)iodonium hexafluorophosphate, tolylcumyl iodonium tetrakis(pentafluorophenyl)borate (trade name: RHODORSIL PI2074, made by Rhodia), and di(4-tert-butyl)iodonium tris(trifluoromethanesulfonyl)methanide (trade name CGI BBI-C1, made by BASF Corporation).

Specific examples of the aromatic sulfonium complex salt include 4-thiophenyl diphenyl sulfonium hexafluoroantimonate (trade name: CPI-101A, made by San-Apro Ltd.), thiophenyldiphenyl sulfonium tris(pentafluoroethyl)trifluorophosphate (trade name: CPI-210S, made by San-Apro Ltd.), 4-{4-(2-chlorobenzoyl)phenylthio}phenyl bis(4-fluorophenyl)sulfonium hexafluoroantimonate (trade name: SP-172, made by ADEKA Corporation), a mixture of aromatic sulfonium hexafluoroantimonates containing 4-thiophenyldiphenyl sulfonium hexafluoroantimonate (trade name: CPI-6976, made by ACETO Corporation, USA), triphenylsulfonium tris(trifluoromethanesulfonyl)methanide (trade name: CGI TPS-C1, made by BASF Corporation), tris[4-(4-acetylphenyl)sulfonylphenyl]sulfonium tris(trifluoromethylsulfonyl)methide (trade name: GSID 26-1, made by BASF Corporation), and tris[4-(4-acetylphenyl)sulfonylphenyl]sulfonium tetrakis(2,3,4,5,6-pentafluorophenyl)borate (trade name: IRGACURE PAG290, made by BASF Corporation).

Among the cationic photopolymerization initiators, the aromatic sulfonium complex salt is preferred due to the high processability into a vertical rectangle and the high thermal stability in the photosensitive image forming step. In particular, 4-{4-(2-chlorobenzoyl)phenylthio}phenyl bis(4-fluorophenyl)sulfonium hexafluoroantimonate, a mixture of aromatic sulfonium hexafluoroantimonates containing 4-thiophenyl diphenyl sulfonium hexafluoroantimonate, and tris[4-(4-acetylphenyl)sulfonylphenyl]sulfonium tetrakis(2,3,4,5,6-pentafluorophenyl)borate are preferred.

The cationic photopolymerization initiators (C) may be singly used or two or more of them may be used in combination. The cationic photopolymerization initiator component (C) has an effect of absorbing light. Accordingly, in the case of a thick film (e.g. 50 μm or more), use of a not excessive amount of the component (C) (e.g. 15 mass % or less) is preferred for the light to permeate sufficiently into the depth for curing. On the other hand, in order to obtain a sufficient curing rate of a thick film, use of a certain amount of the component (C) (e.g. 3 mass % or more) is preferred. In the case of a thin film, the component (C) exhibits sufficient performance for initiating polymerization with a small amount of addition (e.g. 1 mass % or more). In the case of a thin film, though the optical transparency to the depth is not greatly reduced even with a large amount of use, use of a not excessive amount of the component (C) is preferred in view of economy (to prevent unnecessary use of an expensive initiator). Considering these factors, the blending ratio of the cationic photopolymerization initiator (C) in the photosensitive resin composition of the present invention is typically 0.1 to 15 mass %, preferably 0.2 to 8 mass % relative to the total mass of the epoxy resin component (A), the polyol compound component (B) and the reactive epoxy monomer (E), though not particularly limited thereto. In the case where the cationic photopolymerization initiator (C) has a high molar absorption coefficient in a wavelength region of 300 to 380 nm, however, the amount blended is required to be properly controlled depending on the thickness of the photosensitive resin composition to be used.

The epoxy group-containing silane compound (D) contained in the photosensitive resin composition of the present invention improves the tight adhesion to a substrate in the step of using the composition of the present invention, and also improves the interlayer adhesion of a multi-layer structure made from the composition of the present invention. The epoxy group-containing silane compound (D) does not interfere the storage stability of the photosensitive resin composition of the present invention.

Preferred examples of the epoxy group-containing silane compound (D) include an epoxy group-containing alkoxysilane compound. Examples of the epoxy group-containing alkoxysilane compound include 3-glycidoxypropyltrimethoxysilane, 3-glycidoxypropylmethyldimethoxysilane, 3-glycidoxypropyltriethoxysilane, and 2-(3,4-epoxy cyclohexyl)ethyltrimethoxysilane. These may be used singly or two or more of them may be used in combination.

The blending ratio of the epoxy group-containing silane compound (D) in the photosensitive resin composition of the present invention is typically 1 to 15 mass %, preferably 3 to 10 mass % relative to the total mass of the epoxy resin (A), the polyol compound (B), the cationic photopolymerization initiator (C), and the reactive epoxy monomer (E).

The reactive epoxy monomer (E) contained in the photosensitive resin composition of the present invention contributes improvement in the flexibility and pliability of an uncured and cured film formed from the photosensitive resin composition of the present invention, and improvement in the adhesion of a cured film. The reactive epoxy monomer (E) contains the epoxy compound represented by the Formula (10) and/or the Formula (11).

In Formula (10), the divalent aliphatic hydrocarbon group represented by $R_5$ means a group of atoms (residue) in an aliphatic hydrocarbon having a straight or branched chain, with 2 hydrogen atoms removed, including carbon atoms of from 1 to 11, preferably from 1 to 8. Examples of the divalent aliphatic hydrocarbon group represented by $R_5$ include a straight-chain aliphatic hydrocarbon group such as a methylene group, an ethylene group, a propylene group, a butylene group, and a pentylene group, and a branched-chain aliphatic hydrocarbon group composed of the straight-chain aliphatic hydrocarbon group to which an alkyl group is bonded as a side chain.

The epoxy compound represented by Formula (10) is typically a diglycidyl ether of aliphatic dihydric alcohol. Specific examples thereof include neopentyl glycol diglycidyl ether, propylene glycol diglycidyl ether, butyl ethyl propane diglycidyl ether, methyl propane diglycidyl ether, trimethyl pentane diglycidyl ether, ethylene glycol diglycidyl ether, 1,4-butanediol diglycidyl ether, and 1,6-hexanediol diglycidyl ether. Among these, neopentyl glycol diglycidyl ether, ethylene glycol diglycidyl ether, and 1,6-hexanediol diglycidyl ether are preferred.

In Formula (11), the trivalent aliphatic hydrocarbon residue represented by $R_6$ means a group of atoms (residue) in an aliphatic hydrocarbon having a straight or branched chain, with 3 hydrogen atoms removed, including carbon atoms of from 1 to 11, preferably from 1 to 8. Examples of the trivalent aliphatic hydrocarbon residue represented by $R_6$ include one to which an alkyl group is bonded as a side chain.

The epoxy compound represented by Formula (11) is typically a triglycidyl ether of aliphatic trihydric alcohol. Specific examples thereof include trimethylol propane triglycidyl ether and glycerol triglycidyl ether. In particular, trimethylol propane triglycidyl ether is preferred.

In Formulas (10) and (11), with a carbon number of 11 or less of the aliphatic hydrocarbon groups represented by $R_5$ and $R_6$, compatibility with other components and coating quality of the resin composition can be properly maintained to achieve good developability, which is advantageous to form a high-resolution photosensitive image.

In the photosensitive resin composition of the present invention, the blending ratio of the reactive epoxy monomer (E) is typically 2 to 12 mass %, preferably 3 to 10 mass %, relative to the total mass of the epoxy resin (A) and the polyol compound (B).

The reactive epoxy monomer (E) contained in the photosensitive resin composition of the present invention may further include a reactive epoxy monomer other than the epoxy compound(s) represented by the Formula (10) and/or the Formula (11) for use in combination. The reactive epoxy monomer for combination use is not particularly limited, and the blending ratio thereof is not particularly limited as long as it does not impair the effects of the present invention.

The photosensitive resin composition of the present invention may include the solvent (F) to reduce the viscosity of the resin composition for improvement in the coatability. An organic solvent for common use in paints, inks, and the like may be used as the solvent without specific limitations, as long as each of the components of the photosensitive resin composition can be dissolved without chemical reactions with the components. Specific examples of the solvent (F) include: ketones such as acetone, ethyl methyl ketone, methyl isobutyl ketone, and cyclopentanone; aromatic hydrocarbons such as toluene, xylene, and methoxybenzene; glycol ethers such as dipropylene glycol dimethyl ether and dipropylene glycol diethyl ether, and propylene glycol monomethyl ether; esters such as ethyl lactate, ethyl acetate, butyl acetate, methyl-3-methoxy propionate, carbitol acetate, propylene glycol monomethyl ether acetate, and γ-butyrolactone; alcohols such as methanol and ethanol; aliphatic hydrocarbons such as octane and decane; and petroleum solvents such as petroleum ether, petroleum naphtha, hydrogenated petroleum naphtha and solvent naphtha.

These solvents may be used singly or two or more of them may be used in combination. The solvent (F) is added to control the film thickness and the coatability during application to a substrate. The usage of the solvent (F) for properly maintaining the solubility of the main component of the resin composition, the volatility of each of the components, the viscosity of the composition, and the like may be typically 95 mass % or less in the photosensitive resin composition including the solvent. The usage is preferably 5 to 95 mass %, more preferably 10 to 90 mass %.

The photosensitive resin composition of the present invention may further include a sensitizer for absorbing UV rays and imparting the absorbed light energy to the cationic photopolymerization initiator, in particular, to an aromatic iodonium complex salt. Preferred examples of the sensitizer include thioxanthones and anthracene compounds having alkoxy groups at the 9th and 10th positions (9,10-dialkoxyanthracene derivatives). Examples of the alkoxy group include C1 to C4 alkoxy groups such as a methoxy group, an ethoxy group, a propoxy group, and a butoxy group. The 9,10-dialkoxyanthracene derivatives may further have a substituent. Examples of the substituent include a halogen atom such as a fluorine atom, a chlorine atom, a bromine atom, and an iodine atom, C1 to C4 alkyl groups, a sulfonic acid alkyl ester group, and a carboxylic acid alkyl ester group. Examples of the alkyl in the sulfonic acid alkyl ester group and the carboxylic acid alkyl ester group include C1 to C4 alkyls. The substitution position for the substituents is preferably the second position.

Specific examples of the thioxanthones include 2,4-dimethylthioxanthone, 2,4-diethylthioxanthone, 2-chlorothioxanthone, 2-isopropylthioxanthone, and 2,4-diisopropylthioxanthone. In particular, 2,4-diethylthioxanthone (trade name: KAYACURE DETX-S, made by Nippon Kayaku Co., Ltd.) and 2-isopropylthioxanthone are preferred.

Examples of the 9,10-dialkoxyanthracene derivatives include 9,10-dimethoxyanthracene, 9,10-diethoxyanthracene, 9,10-dipropoxyanthracene, 9,10-dibutoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulfonic acid methyl ester, 9,10-diethoxy anthracene-2-sulfonic acid methyl ester, and 9,10-dimethoxyanthracene-2-carboxylic acid methyl ester.

The sensitizers may be used singly or two or more of them may be used in combination. Use of 2,4-diethylthioxanthone and 9,10-dimethoxy-2-ethylanthracene is most preferred. Since a small amount of sensitizer can exhibit the effect, the usage ratio thereof is typically 30 mass % or less, preferably 20 mass % or less relative to the mass of the cationic photopolymerization initiator component (C).

In order to reduce the adverse effects of the ions derived from the cationic photopolymerization initiator (C), an ion catcher may be added to the resin composition of the present invention, on an as needed basis. Specific examples of the ion catcher include: alkoxy aluminum such as tris methoxy aluminum, tris ethoxy aluminum, tris isopropoxy aluminum, isopropoxy diethoxy aluminum, and tris butoxy aluminum; phenoxy aluminum such as tris phenoxy aluminum and tris p-methylphenoxy aluminum; and an organic aluminum compound such as tris acetoxy aluminum, tris stearate aluminum, tris butyrate aluminum, tris propionate aluminum, tris acetylacetonate aluminum, tris trifluoro acetylacetonate aluminum, tris ethylacetoacetate aluminum, diacetylacetonate dipivaloylmethanate aluminum, and diisopropoxy(ethylacetoacetate)aluminum. The components may be used singly or two or more of them may be used in combination. The amount thereof blended may be typically 10 mass % or less relative to the total mass of the epoxy resin (A), the polyol compound (B), the cationic photopolymerization initiator (C), and the reactive epoxy monomer (E).

The photosensitive resin composition of the present invention may include various additives such as a thermoplastic resin, a colorant, a thickener, a defoamer, and a leveling agent on an as needed basis. Examples of the thermoplastic resin include polyether sulfone, polystyrene, and polycarbonate. Examples of the colorant include phthalocyanine blue, phthalocyanine green, iodine green, crystal violet, titanium oxide, carbon black, naphthalene black, anthraquinone red, quinacridone red, and diketopyrrolopyrrole red. The rough guide for the amount of each of the additives used is, for example, 0 mass % or more and 30 mass % or less in the photosensitive resin composition of the present invention excluding the solvent. The amount for each used, however, may be appropriately increased or decreased depending on the intended use thereof and the required function of the cured film.

Examples of the thickener include Orben, Bentone, and montmorillonite. Examples of the defoamer include a silicone defoamer, a fluoroalkyl defoamer, and a polymer defoamer. The rough guide for the amount of each of the additives used is, for example, 0 mass % or more and 10 mass % or less in the photosensitive resin composition of the present invention excluding the solvent. The amount for each used, however, may be appropriately increased or decreased depending on the intended use thereof and the quality of coating.

The photosensitive resin composition of the present invention may further include an optional inorganic filler such as barium sulfate, barium titanate, silicon oxide, amorphous silica, talc, clay, magnesium carbonate, calcium carbonate, aluminum oxide, aluminum hydroxide, montmorillonite, and mica powder. The amount of inorganic filler used may be typically 0 mass % or more and 60 mass % or less relative to the mass of the photosensitive resin composition of the present invention excluding the solvent. The amount used, however, may be appropriately increased or decreased depending on the intended use and the required function of the cured film. Similarly, an organic filler such as polymethyl methacrylate, rubber, a fluoro polymer, and polyurethane powder may be incorporated into the photosensitive resin composition of the present invention.

The photosensitive resin composition of the present invention may be prepared by mixing and stirring essential components including the epoxy resin (A), the polyol compound (B), the cationic photopolymerization initiator (C), the epoxy group-containing silane compound (D), and the reactive epoxy monomer (E), and, on an as needed basis, together with optional components including the solvent (F), the sensitizer, the ion catcher, the thermoplastic resin, the colorant, the thickener, the defoamer, the leveling agent, and the inorganic filler, by a conventional method. In the step of mixing and stirring, a disperser such as a dissolver, a homogenizer, and a three-roll mill may be used on an as needed basis. In addition, filtration may be performed after mixing, with use of a mesh, a membrane filter, or the like.

The method for forming a cured resist film from the photosensitive resin composition of the present invention is described in the following.

The photosensitive resin composition of the present invention may be used in a liquid form, preferably with addition of a solvent for application to a substrate. The application may be performed by a spin coating method including the steps of: measuring and dispensing the photosensitive resin composition of the present invention diluted to a desired viscosity with a solvent onto a substrate; accelerating the rotation of the substrate up to a predetermined rotation speed; and maintaining the rotation speed at constant so as to obtain a desired film thickness. Spin coating can be performed at a various rotation speed for control of the film thickness. Alternatively, the photosensitive resin composition can be applied to a substrate by a different coating method such as roller coating, doctor knife coating, slot coating, immersion coating, gravure coating, and spray coating.

After coating, the solvent can be evaporated by dry baking (pre-baking). The dry baking conditions can be selected to form a semi-cured dry coating film of a photoresist. In typical conditions, using a hot plate with a smooth surface, a coating film in contact with the surface or in a nearly contacting state may be dried at 65° C. for 1 to 15 minutes, and subsequently at 90 to 125° C. for 5 to 120 minutes depending on the thickness of the coating film, the volatility of solvent, and the thermal conductivity and thickness of the substrate. Alternatively, the dry baking may be performed in a convection oven. Subsequently, the dried coating film of the photosensitive resin composition is subjected to exposure to bright lines in a near UV wavelength range of 300 to 500 nm from a medium pressure or ultra-high pressure mercury lamp through a photo mask with a desired mask pattern, energy ray irradiation with X-ray radiation from a synchrotron radiation source, or electron beam irradiation with a direct or patterned exposure, so that a photosensitive image can be formed. A contact printing, a proximity printing, or a projection printing may be employed. Subsequently to the exposure, post exposure baking may be performed in order to accelerate the polymerization reaction by acid catalyst activity at the exposed regions in the coating film. The typical conditions include processing on the hot plate at 65° C. for 1 to 5 minutes and subsequently at 95° C. for 1 to 60 minutes depending on the thickness of the coating film and the thermal conductivity and thickness of the substrate.

Subsequently, in order to dissolve and remove unexposed regions, immersion in an organic solvent developer for 2 to 30 minutes may be typically performed depending on the thickness of the coating film and the titer of the developer solvent. Further, the developer attached to the cured film can be removed by rinsing the developed image with application of a rinsing solvent. The attached developer contains the dissolved photoresist components, easily causing contamination as residues on a photosensitive image when dried. Accordingly, removal of the attached developer is desired. In the immersion method, the attachment of residues can be prevented by multi-stage development with preparation of a clean developer tank.

Alternatively, the developer solvent can be applied by spraying with use of any one of an explosion-proof atomizing spray nozzle and an explosion-proof micro-shower head spray nozzle. Examples of alternative development methods further include applying developer by a puddle method. In general, the puddle method includes the successive steps of: placing a substrate as development target on a rotating tool head; measuring and dispensing an adequate amount of developer to form a layer or a puddle stagnating on the entire area of the substrate rotating at a low speed; stopping the rotation of the substrate, standing the formed developer puddle still on the substrate for a predetermined time; accelerating the rotation of the substrate for removal of the used developer by spinning; and decelerating the rotation until stopped. The sequence is typically repeated several times on an as needed basis, until a clear photosensitive image is obtained.

Examples of the suitable developer include propylene glycol monomethyl ether acetate, γ-butyrolactone, acetone, cyclopentanone, diacetone alcohol, tetrahydrofurfuryl alcohol, N-methylpyrrolidone, anisole, and ethyl lactate, though not particularly limited thereto. Propylene glycol monomethyl ether acetate is particularly preferred, capable of well dissolving unexposed regions with relatively low cost.

Examples of the suitable rinsing solution include the developer solvents described above, methanol, ethanol, isopropanol, and n-butyl acetate. Among these, acetone, ethanol and isopropanol are particularly preferred, capable of speedy cleaning and rapid drying.

After the rinsing step, a heating treatment (hard baking) may be performed under a temperature condition at 130 to 200° C. depending on the heat resistance of the substrate, as the last step of manufacturing a cured film. By thermally curing the film, a permanent cured film (resist) satisfying various properties can be obtained.

Examples of the usable substrate material include silicon, silicon dioxide, tantalum, lithium tantalate, silicon nitride, alumina, glass, glass ceramics, gallium arsenide, indium phosphide, copper, aluminum, nickel, iron, steel, copper-silicon alloy, glass coated with indium-tin oxide, an organic film such as polyimide and polyester, metals, semiconductors, and any substrate containing patterned regions of insulating material, though not particularly limited thereto.

The photosensitive resin composition of the present invention may be also used as a resist laminate, being sandwiched by two substrates. For example, after the photosensitive resin composition diluted with a solvent is applied onto a base film (i.e. a substrate) with use of a roll coater, a die coater, a knife coater, a bar coater, a gravure coater, or the like, the solvent is removed in a drying oven set at 45 to 100° C. Subsequently, a cover film (i.e. another substrate) and the like is laminated thereon to produce a resist laminate. On this occasion, the thickness of the resist on the base film may be controlled to 2 to 100 µm. Examples of the base film and the cover film for use as substrates include films of polyester, polypropylene, polyethylene, TAC, and polyimide. These films may be release-treated with a silicone release agent, a non-silicone release agent, or the like, on an as needed basis. In the case of using the resist laminate, for example, after the cover film is detached, the resist laminate is transferred to the substrate at a temperature of 40 to 100° C., under a pressure of 0.05 to 2 MPa, with a hand roll, a laminator, or the like, so as to be subjected to exposure, post exposure baking, development, and heating treatment in the same way as in the case of the liquid photosensitive resin composition.

The resist laminate of the present invention enables use of the photosensitive resin composition in a dry film resist form, by which the steps of applying to a support or a substrate and drying can be omitted. Consequently, formation of a fine pattern with use of the photosensitive resin composition of the present invention can be more easily achieved.

In the case of using the cured film for a MEMS package, a semiconductor package, and/or a component for forming microreactors, the photosensitive resin composition of the present invention may be applied to a substrate and dried to form a first layer of the photosensitive resin coating film. The first layer may be subjected to exposure and post exposure baking, to which the photosensitive resin composition may be further applied and dried to form a second layer of the photosensitive resin coating film. The second layer may be then subjected to exposure and post exposure baking. The steps are repeated and development and hard baking are collectively performed in the final step, so that a complicated multi-layered pattern can be formed. Alternatively, a multi-layered pattern may be formed by developing and hard baking a first layer, applying and drying a second layer, performing alignment exposure through a photo mask, and repeating development and hard baking. Alternatively, the photosensitive resin layers may be formed by laminating dry film resists, respectively.

The "package" referred to herein means a sealing method or sealed product for use in blocking intrusion of gas and liquid from outside so as to maintain the stability of a substrate, a wiring, a device, and the like. The package described herein includes: a hollow package for packing a product having a drive unit such as MEMS and the oscillator of an SAW device and the like; a surface protection for preventing deterioration of a semiconductor substrate, a printed wiring board, a wiring, and the like; a resin seal for sealing components for forming microreactors with a top plate; and the like. The "wafer level package" referred to herein means: a product made by successive steps of protective film formation, terminal processing and wiring, packaging in a wafer state, and cutting out into individual chips from the wafer; or a method for three-dimensional processing fine micro- or nano-flowpaths and orifice plates collectively within a wafer.

With use of the photosensitive resin composition of the present invention, a fine pattern having a vertical sidewall profile can be formed by photolithography. The cured product thereof has properties of low stress and being excellent in resistance to moisture and heat. The present invention provides a permanent resist and a cured product which satisfy properties required in the fields of semiconductors and MEMS/micromachine applications, in particular, an MEMS package, a semiconductor package, a component for forming microreactors, being very useful in the fields.

EXAMPLES

The present invention is described in detail in the following, with reference to Examples. The Examples are provided for favorably illustrative purposes only, but are not intended to limit the present invention.

Examples 7 to 12 and Comparative Examples 8 to 14

Preparation of Photosensitive Resin Composition Solution (Liquid Resist)

In accordance with the amounts blended described in Table 2 (unit in parts by mass (for a solution product, in terms of solid content of the component)), compounds of the epoxy resin (A), the polyol compound (B), the cationic photopolymerization initiator (C), the epoxy group-containing silane compound (D), and the reactive epoxy monomer (E) were diluted with cyclopentanone so as to have a concentration of 65 mass % or 34 mass % (the 65 mass % dilution is referred to as a "liquid resist A", and 34 mass % dilution is referred to as a "liquid resist B"), mixed and dissolved in a flask having a stirrer at 60° C. for 1 hour. After cooling, filtration was performed with a membrane filter with a pore size of 1.0 μm, so that each of the photosensitive resin composition solutions (liquid resist) of the present invention and for comparison was obtained.

Patterning of Photosensitive Resin Composition

Each of the liquid resists A obtained in Examples 7 to 12, and Comparative Examples 8 to 14 was applied to a silicon wafer with a spin coater, and then subjected to pre-baking for 10 minutes with a hot plate at 95° C., so that a photosensitive resin composition layer having a dry film thickness of 25 μm after coating was obtained. The bulge portion of the coating film at a wafer edge face was then dissolved and removed. After drying, the coating film was exposed to the i-line in a dose of exposure of 500 mJ/cm$^2$ (soft contact) with an i-line exposure device (MASK ALIGNER made by Ushio Inc.) through a photo mask having a gray scale for resolution evaluation. Subsequently, post exposure baking (hereinafter referred to as "PEB") was performed for 5 minutes with a hot plate at 95° C. Subsequently, immersion development was performed at 23° C. for 3 minutes with SU-8 DEVELOPER (trade name, made by MicroChem Corp., mainly composed of propylene glycol monomethyl ether acetate). After rinsing with isopropanol and drying, a resin pattern cured on the silicon wafer was obtained.

Evaluation of Sensitivity, Resolution, and Cracks of Photosensitive Resin Composition Sensitivity The dose of exposure to achieve the best mask transfer accuracy in the patterning was defined as the optimal dose of exposure, and the sensitivity of each of the photosensitive resin compositions was evaluated. The sensitivity increases as the optimal dose of exposure decreases. The results are shown in the following Table 2.

Resolution

After the steps of pre-baking, dissolving and removing the bulge portion of the coating film at the wafer edge face, and drying, each of the liquid resists A was subjected to the optimal dose of exposure for each composition (soft contact, i-line, refer to the dose of exposure in Table 2) using a photo mask having 1 to 100 μm lines-and-spaces and a circular hole pattern, and subjected to PEB for 5 minutes with a hot plate at 95° C. Subsequently, immersion development was performed at 23° C. for 3 minutes with SU-8 DEVELOPER (trade name, made by MicroChem Corp., mainly composed of propylene glycol monomethyl ether acetate). Rinsing with isopropanol and subsequent drying were then performed. Among the resolved resist patterns in a vertical sidewall profile without bending and residues, the width of the finest pattern tightly adhered to the substrate was measured for evaluation of the resolution. The results are shown in the following Table 2.

Evaluation on Cracks

Evaluation was made on the occurrence of cracks in the resin pattern obtained from each of the liquid resist A through the steps of pre-baking, dissolving and removing the bulge portion of coating film at a wafer edge face, drying, exposing, etc. The evaluation criteria "XX" (very poor) stands for the state having cracking in the whole surface of a film (occurrence of discontinuous fragmentation reaching to the bottom of a film), "X" (poor) stands for the state having splits only at the corner of a rectangular hole pattern (fragmentation state occurring in the outermost surface part of a film), and "0" (good) stands for the state of no occurrence of splits at all. The results are shown in the following Table 2.

Evaluation on Resistance to Moisture and Heat on Adhesion of Cured Product of Photosensitive Resin Composition Each of the liquid resists A obtained in Examples 7 to 12 and Comparative Examples 8 to 14 was applied onto a silicon wafer with a spin coater, and then prebaked for 10 minutes with a hot plate at 95° C., so that a photosensitive resin composition layer having a dry film thickness of 25 μm after coating was obtained. The bulge portion of the coating film at a wafer edge face was then dissolved and removed. After drying, the coating film was exposed to the optimal dose of exposure for each composition (soft contact, i-line, refer to the dose of exposure in Table 2) with an i-line exposure device (MASK ALIGNER made by Ushio Inc.) through a pattern photo mask for evaluation of resistance to moisture and heat on adhesion. Subsequently, PEB was performed for 5 minutes with a hot plate at 95° C. Subsequently, immersion development was performed at 23° C. for 3 minutes with SU-8 DEVELOPER (trade name, made by MicroChem Corp., mainly composed of propylene glycol monomethyl ether acetate). After rinsing with isopropanol and drying, through a hard baking treatment in an oven at 200° C. for 60 minutes, a resin pattern cured on the silicon wafer was obtained. The wafer with a resin pattern was cut and immersed in each of a water-soluble organic solvent-containing aqueous solution A (composition: 10 mass % of 2-imidazolidinone, 7.5 mass % of 2,2'-sulfonyldiethanol, 5 mass % of glyceritol, 5 mass % of pentylene glycol, and 0.4 mass % of ethylene oxide-modified acetylenol), a water-soluble organic solvent-containing aqueous solution B (composition: 30 mass % of gamma-butyrolactam, 10 mass % of 2,2'-oxydiethanol, 5 mass % of hexamethylene glycol, and 0.2 mass % of ethylene oxide-modified acetylenol), and a water-soluble organic solvent-containing aqueous solution C (composition: 15 mass % of glyceritol, 5 mass % of polyethylene glycol #400, and 3 mass % of polyoxyethylene lauryl ether), in a PTFE internal cylinder-type closed vessel, so as to be subjected to a test for resistance to moisture and heat at 80° C. for 24 hours. The adhesion force of the resin pattern before and after the test was measured with a shear strength testing machine. The case having no deterioration in the adhesion force was evaluated as "0" (good). The case having deterioration in the adhesion force was evaluated as "X" (poor). The case having detachment or peeling of a pattern after the test was evaluated as "XX" (very poor). The results are shown in the following Table 2.

Internal Stress Measurement of Substrate with Film

The "internal stress of substrate with film" is obtained by measuring the warpage of a three-point-supported silicon wafer substrate (diameter: 100 mm, thickness 0.5 mm) before and after film formation with a stylus surface profile measuring instrument DEKTAK8 (trade name, made by Veeco Instruments, Inc.), and by converting the change in warpage before and after film formation into stress. In general, the stress of a film is not affected by the shape and material of the substrate on which film is formed. Accordingly, the measurement result of warpage of a silicon wafer substrate before and after formation of a film on the substrate indicates the internal stress. When a resin film shrinks in curing, compression stress occurs. As the stress increases, the warpage of a substrate increases due to the stress in the cured film, resulting in the occurrence of cracking such as crazing and cracks in the film itself. The smaller the internal stress is, the smaller the warpage of the substrate becomes, resulting in elimination of cracking in the film itself.

Each of the liquid resists B obtained in Examples 7 to 12, and Comparative Examples 8 to 14 was applied to a silicon wafer (diameter: 100 mm, thickness: 0.5 mm) with a spin coater after measurement of warpage, and then subjected to pre-baking for 5 minutes with a hot plate at 95° C., so that a photosensitive resin composition layer having a dry film thickness of 2.0 µm after coating was obtained. The bulge portion of the coating film at a wafer edge face was then dissolved and removed. After drying, the entire film surface was exposed to an optimal dose of exposure (soft contact, i-line, refer to the dose of exposure in Table 2) for each composition with an i-line exposure device (MASK ALIGNER made by Ushio Inc.). Subsequently, PEB was performed for 5 minutes with a hot plate at 95° C. Subsequently, through a hard baking treatment for 60 minutes in an oven at 200° C., a silicon wafer with a cured resin film was obtained. Each of the samples of a substrate with a film was sufficiently cooled at 23° C., and subjected to the measurement of warpage for calculation of the compression stress. The results are shown in Table 2.

TABLE 2

Components and evaluation results of photosensitive resin composition

| | | Example | | | | | | Comparative Example | | | | | | |
|---|---|---|---|---|---|---|---|---|---|---|---|---|---|---|
| | | 7 | 8 | 9 | 10 | 11 | 12 | 8 | 9 | 10 | 11 | 12 | 13 | 14 |
| Epoxy resin (A) | (A-1) | 77.5 | 75.79 | 76.25 | 80 | 80 | 80 | | 77.5 | | | 76.25 | 76.25 | |
| | (A-2) | 12.5 | 14.21 | 11.25 | | 15 | 15 | | 12.5 | | | 11.25 | 11.25 | |
| | (A-3) | | | | 15 | | | | | | | | | |
| Epoxy resin (A') | (A'-1) | | | | | | | 88 | | | | | | |
| | (A'-2) | | | | | | | 12 | | 55.6 | | | | |
| | (A'-3) | | | | | | | | | | 100 | | | |
| | (A'-4) | | | | | | | | | | | | | 95 |
| Polyol compound (B) | (B-1) | 5 | | 10 | | | | | 10 | 44.4 | | 10 | | |
| | (B-2) | | 5 | | | | | | | | | | | |
| | (B-3) | | | | 5 | | | | | | | | | |
| | (B-4) | | | | | 5 | | | | | | | | |
| | (B-5) | | | | | | 5 | | | | | | | 5 |
| | (B'-1) | | | | | | | | | | | | 10 | |
| Cationic photo-polymerization initiator (C) | (C-1) | 2.5 | 2.5 | 4 | | 3 | | | 4 | | 2 | 4 | 2.5 | |
| | (C-2) | | | | 5 | | | 4 | | 2.8 | | | | |
| | (C-3) | | | | | | 1 | | | | | | | 1 |
| Epoxy group-containing silane compound (D) | (D-1) | 5 | 5 | 5 | 5 | 5 | | | 5 | | 5 | 5 | 5 | |
| | (D-2) | | | | | | 7 | | | | | | | 7 |
| Reactive epoxy monomer (E) | (Eii-1) | 5 | | 7.5 | | 5 | 7.5 | | | | | | | 7.5 |
| | (Eii-2) | | 7.5 | | 5 | | | | | | | | 7.5 | |
| Epoxy monomer (E') | (Eii'-1) | | | | | | | | | | | 7.5 | | |
| Optimal dose of exposure [mJ/cm²] | | 125 | 125 | 150 | 125 | 125 | 125 | 150 | 150 | 500 | 300 | X·3 | 300 | 500 |
| Resolution [µm] | | 3 | 4 | 5 | 4 | 4 | 4 | 8 | 7 | 100< | 10 | | 75 | 20 |
| Cracks in pattern X·1 | | ○ | ○ | ○ | ○ | ○ | ○ | X X | X | ○ | X X | | ○ | X X |

TABLE 2-continued

Components and evaluation results of photosensitive resin composition

| | Example | | | | | | Comparative Example | | | | | | |
|---|---|---|---|---|---|---|---|---|---|---|---|---|---|
| | 7 | 8 | 9 | 10 | 11 | 12 | 8 | 9 | 10 | 11 | 12 | 13 | 14 |
| Resistance to moisture and heat on adhesion ※2 | | | | | | | | | | | | | |
| (liquid A) | ◯ | ◯ | ◯ | ◯ | ◯ | ◯ | X | ◯ | X X | X | | X | ◯ |
| (liquid B) | ◯ | ◯ | ◯ | ◯ | ◯ | ◯ | X | ◯ | X X | X | | X | X |
| (liquid C) | ◯ | ◯ | ◯ | ◯ | ◯ | ◯ | X | ◯ | X X | X | | X | X |
| Internal stress of substrate with film [MPa] | 22 | 22 | 18 | 23 | 20 | 23 | 45 | 24 | 30 | 47 | | 28 | 44 |

※1 ◯: No occurrence of splits, X: Occurrence of splits in hole corner, X X: Occurrence of cracks in the whole surface of film. "Crack" means a state having discontinuous fragmentation reaching to the bottom of a film. "Split" means a state of fragmentation occurring in the film surface part.
※2 ◯: no deterioration in adhesion force, X: occurrence of deterioration in adhesion force, X X: occurrence of detachment and peeling
※3 Evaluation impossible due to incompatibility, being unsuitable as resist.

In Table 2, (A-1) to (Eii'-1) represent the following materials, respectively.

(A-1): NC-6300H (trade name, made by Nippon Kayaku Co., Ltd.; epoxy resin (a); epoxy equivalent: 225 g/eq.)

(A-2): NER-7604 (trade name, made by Nippon Kayaku Co., Ltd.; epoxy resin (b); in Formula (2), $R_1$ and $R_2$ are each a hydrogen atom, with m of approximately 6; epoxy equivalent: 330 g/eq.)

(A-3): NER-7403 (trade name, made by Nippon Kayaku Co., Ltd.; epoxy resin (b); in Formula (2) $R_1$ and $R_2$ are a hydrogen atom, with m of approximately 4; epoxy equivalent: 250 g/eq.)

(A'-1): EPON SU-8 (trade name, made by Momentive Performance Materials Inc.; bisphenol A novolac type epoxy resin; epoxy equivalent: 213 g/eq.)

(A'-2): ERL-4221: (trade name, made by Polysciences Inc., 3,4-epoxycyclohexylmethyl-3,4-epoxycyclohexylcarboxylate, epoxy equivalent: 126 g/eq.)

(A'-3): EHPE-3150: (trade name, made by Daicel Corporation, 1,2-epoxy-4-(2-oxiranyl)cyclohexane adduct of 2,2-bis(hydroxymethyl)-1-butanol, epoxy equivalent: 180 g/eq.)

(A'-4): XD-1000 (trade name, made by Nippon Kayaku Co., Ltd., dicyclopentadiene phenol condensation-type epoxy resin, epoxy equivalent: 253 g/eq.)

(B-1): CAPA 3050 (trade name, made by Perstorp Holding AB; trifunctional polyol; in Formula (4), y is 1 to 2, and $R_4$ represents a trivalent aliphatic hydrocarbon group having 6 carbon atoms; molecular weight: 540; OH equivalent: 310 mg KOH/g)

(B-2): PLACCEL 308 (trade name, made by Daicel Corporation; trifunctional polyol; in Formula (4), y is 2 to 3, and $R_4$ represents a trivalent aliphatic hydrocarbon group having 6 carbon atoms; molecular weight: 850; OH equivalent: 195 mg KOH/g)

(B-3): PLACCEL 312 (trade name, made by Daicel Corporation; trifunctional polyol; in Formula (4), y is 3 to 4, and $R_4$ represents a trivalent aliphatic hydrocarbon group having 6 carbon atoms; molecular weight: 1250; OH equivalent: 135 mg KOH/g)

(B-4): PLACCEL 205 (trade name, made by Daicel Corporation; difunctional polyol; in Formula (3), x is 1 to 3, and $R_3$ represents a divalent aliphatic hydrocarbon group having 4 to 6 carbon atoms; molecular weight: 530; OH equivalent: 210 mg KOH/g)

(B-5): PLACCEL 220 (trade name, made by Daicel Corporation; difunctional polyol; in Formula (3), x is 8 to 9, and $R_3$ represents a divalent aliphatic hydrocarbon group having 5 carbon atoms; molecular weight: 2000; OH equivalent: 56 mg KOH/g)

(B'-1): polyethylene glycol 1000 (molecular weight: 1000) (C-1): SP-172 (trade name, made by ADEKA Corporation; 50 wt % propylene carbonate solution; in Table, the amount blended is described in terms of solid content):

(C-2): CPI-6976 (trade name, made by ACETO Corporation, 50 wt % propylene carbonate solution, in Table, the amount blended is described in terms of solid content):

(C-3): IRGACURE PAG290 (Trade name, made by BASF Corporation.)

(D-1): 3-glycidoxypropyl trimethoxysilane (D-2): 3-glycidoxypropyl methyldimethoxysilane (Eii-1): DENACOL EX-321L (trade name, made by Nagase ChemteX Corporation, trimethylolpropane triglycidyl ether, epoxy equivalent: 160 g/eq., an epoxy compound represented by Formula (11), wherein $R_6$ has 6 carbon atoms.)

(Eii-2): SR-NPG (trade name, made by Sakamoto Yakuhin Kogyo Co., Ltd., neopentyl glycol diglycidyl ether, epoxy equivalent: 146 g/eq, an epoxy compound represented by Formula (10), wherein $R_5$ has 5 carbon atoms.)

(Eii'-1): octadecane diol diglycidyl ether (epoxy equivalent: 199 g/eq, an epoxy compound represented by Formula (10), wherein $R_5$ has 18 carbon atoms.)

As seen from the results shown in Table 2, it was found that the properties of the composition obtained in each of the Examples include: high sensitivity with a small optimum dose of exposure; high resolution with resolved dimensions of a photosensitive pattern; low internal stress which causes no cracks in the pattern; and adhesion preserved through moist heating.

Example 26

Resist Laminate Made of Photosensitive Resin Composition of the Present Invention Ethylene glycol dimethyl ether was further added to the blending composition in Example 7 in Table 2, which was mixed and dissolved by stirring in a flask having a stirrer at 60° C. for 1 hour, such that the solution had a viscosity of 3 Pa·s at 25° C. through the dilution. After cooling, membrane filtration with a pore size of 1.0 μm was performed, so that a dry film lacquer of the photosensitive resin composition of the present invention was obtained. The lacquer was uniformly applied to a base film (made of polypropylene made by Mitsubishi Plastics, Inc.; film thickness: 38 μm), which was dried at 60° C. for 5 minutes and at 80° C. for 15 minutes using a hot-air convection dryer. A cover film (made of polypropylene made by Mitsubishi Plastics, Inc.; film thickness: 38 μm) was then laminated onto the exposed surface, so that a resist laminate of a sandwiched dry film resist having a thickness of 25 μm (i.e. a photosensitive resin composition laminate) was obtained.

(Patterning of Dry Film Resist)

After the cover film was detached from the produced resist laminate of the photosensitive resin composition, the resist laminate was laminated on a silicon wafer at a roll temperature of 70° C., under an air pressure of 0.2 MPa, at a rate of 0.5 m/min. Subsequently, the base film was detached to produce a 25 μm-thick photosensitive resin composition layer (i.e. a dry film resist). The photosensitive resin composition layer was subjected to contact exposure, with an i-line exposure device (MASK ALIGNER made by Ushio Inc.). Subsequently, PEB was performed for 5 minutes with a hot plate at 95° C. Subsequently, immersion development was performed at 23° C. for 3 minutes with SU-8 DEVELOPER (trade name, made by MicroChem Corp., mainly composed of propylene glycol monomethyl ether acetate). After rinsing with isopropanol and drying, a resin pattern cured on a substrate was obtained. Even with use of a resist laminate, a cured product with a thin line closely-arranged pattern having a width of 3 μm with a vertical side wall was obtained without residues or cracks, for an optimum dose of exposure of 125 mJ/cm².

INDUSTRIAL APPLICABILITY

The photosensitive resin composition of the present invention enables a fine pattern having a vertical sidewall profile to be formed by photolithography. The cured product has properties including low stress and excellent resistance to moisture and heat. The present invention provides a permanent resist and a cured product having properties required in the fields of semiconductors, MEMS/micromachine applications, particularly required for MEMS packages, semiconductor packages and components for forming microreactors.

The invention claimed is:

1. A photosensitive resin composition comprising: an epoxy resin (A), a polyol compound (B), a cationic photopolymerization initiator (C), an epoxy group-containing silane compound (D), and a reactive epoxy monomer (E);

the epoxy resin (A) comprising an epoxy resin (a) obtained from reaction of a phenol derivative represented by the following Formula (1) and epihalohydrin:

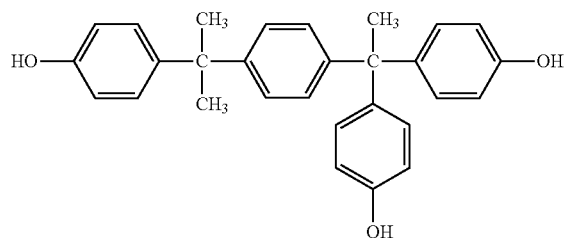

and an epoxy resin (b) represented by the following Formula (2):

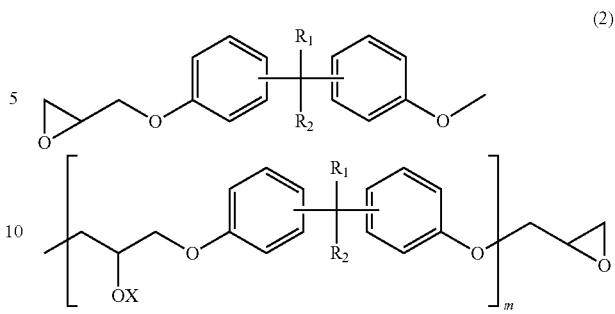

wherein m is an average value, representing a real number in the range from 2 to 30, $R_1$ and $R_2$ each independently represent a hydrogen atom, an alkyl group having 1 to 4 carbon atoms, or a trifluoromethyl group, X each independently represents a hydrogen atom or a glycidyl group, and at least one of a plurality of X present is a glycidyl group;

the polyol compound (B) comprising a polyester polyol represented by the following Formula (3):

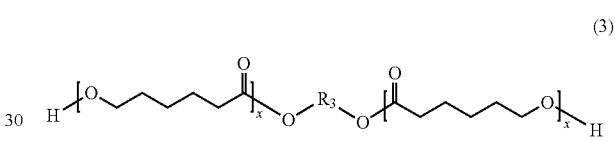

wherein x is an average value, representing a real number in the range from 1 to 9, and $R_3$ represents a divalent aliphatic hydrocarbon group which may contain at least one ether bond within a carbon chain;

and/or a polyester polyol represented by the following Formula (4):

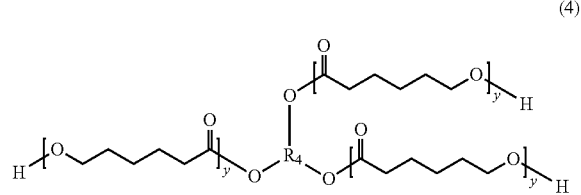

wherein y is an average value, representing a real number in the range from 1 to 6, and $R_4$ represents a trivalent aliphatic hydrocarbon group which may contain at least one ether bond within a carbon chain; and the reactive epoxy monomer (E) comprising an epoxy compound represented by the following Formula (10) and/or an epoxy compound represented by the following Formula (11):

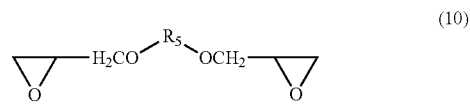

wherein $R_5$ represents a divalent aliphatic hydrocarbon group having 1 to 11 carbon atoms;

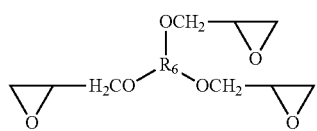 (11)

wherein $R_6$ represents a trivalent aliphatic hydrocarbon group having 1 to 11 carbon atoms;

wherein a blending ratio of the reactive epoxy monomer (E) is 3 to 10 mass % relative to a total mass of the epoxy resin (A) and the polyol compound (B);

wherein a blending ratio of the polyol compound (B) is 5 to 15 mass % relative to a total mass of the epoxy resin (A);

wherein a blending ratio of the cationic photopolymerization initiator (C) is 3 to 8 mass % relative to a total mass of the epoxy resin (A), the polyol compound (B), and the reactive epoxy monomer (E);

wherein a blending ratio of the epoxy group-containing silane compound (D) is 3 to 8 mass % relative to a total mass of the epoxy resin (A), the polyol compound (B), the cationic photopolymerization initiator (C), and the reactive epoxy monomer (E); and wherein the ratio of the amount of the epoxy resin (b) to the amount of the epoxy resin (a) ranges from 10 to 20 mass %.

2. The photosensitive resin composition according to claim 1, wherein the reactive epoxy monomer (E) comprises trimethylolpropane triglycidyl ether.

3. The photosensitive resin composition according to claim 1, wherein the epoxy group-containing silane compound (D) is an epoxy group-containing alkoxysilane compound.

4. The photosensitive resin composition according to claim 1, further comprising a solvent (F).

5. The photosensitive resin composition according to claim 4, wherein a blending ratio of the solvent (F) is 5 to 95 mass % relative to a total mass of the photosensitive resin composition including the solvent (F).

6. A cured product of the photosensitive resin composition according to any one of claims 1, 2, 3, 4 and 5.

7. A resist laminate comprising the photosensitive resin composition according to any one of claim 1, 2, 3, 4 and 5 sandwiched between two substrates.

8. A cured product of a dry film resist obtained from the resist laminate according to claim 7.

* * * * *